(12) United States Patent
Slupe

(10) Patent No.: US 7,369,825 B2
(45) Date of Patent: May 6, 2008

(54) SELECTION OF RADIO STATION BASED ON PREFERRED PROGRAM CONTENT

(75) Inventor: James Phillip Slupe, Caldwell, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1137 days.

(21) Appl. No.: 09/923,707

(22) Filed: Aug. 6, 2001

(65) Prior Publication Data

US 2003/0032399 A1 Feb. 13, 2003

(51) Int. Cl.
*H04B 1/18* (2006.01)

(52) U.S. Cl. .............................. 455/161.3; 455/456.2; 455/186.1; 370/316

(58) Field of Classification Search .................. 455/68, 455/186.1, 161.1–161.3, 553.1, 456.2, 412.1; 340/286.02; 370/316
See application file for complete search history.

(56) References Cited

U.S. PATENT DOCUMENTS

| | | | | |
|---|---|---|---|---|
| 4,476,582 | A * | 10/1984 | Strauss et al. ............ | 455/166.1 |
| 4,969,209 | A * | 11/1990 | Schwob ................... | 455/158.4 |
| 5,086,511 | A * | 2/1992 | Kobayashi et al. ....... | 455/156.1 |
| 5,303,401 | A * | 4/1994 | Duckeck et al. ......... | 455/186.1 |
| 5,613,230 | A * | 3/1997 | Gottfried et al. ........ | 455/161.3 |
| 5,815,814 | A * | 9/1998 | Dennison et al. ........ | 455/456.2 |
| 6,021,320 | A * | 2/2000 | Bickford et al. ......... | 455/186.1 |
| 6,249,514 | B1 * | 6/2001 | Campanella ................ | 370/316 |
| 6,282,412 | B1 * | 8/2001 | Lyons ..................... | 455/186.1 |
| 6,329,904 | B1 * | 12/2001 | Lamb .................... | 340/286.02 |
| 6,389,270 | B1 * | 5/2002 | Nohrden et al. ......... | 455/161.1 |
| 6,684,068 | B1 * | 1/2004 | Tikka et al. ............. | 455/412.1 |
| 6,748,237 | B1 * | 6/2004 | Bates et al. ............. | 455/553.1 |
| 6,850,743 | B2 * | 2/2005 | Davis et al. ............. | 455/161.1 |
| 6,865,379 | B1 * | 3/2005 | Liebenow ................ | 455/161.3 |

* cited by examiner

*Primary Examiner*—Fan Tsang
*Assistant Examiner*—M. S. Alam Elahee

(57) ABSTRACT

A method and apparatus for selecting radio stations for reception based on a preferred program content. A list of radio station identifiers is stored in a memory and organized according to program content specifiers. When a presently received signal fades, the memory is searched for an alternate radio station with similar program content. If none is available, a prioritized list of alternative program content preferences is accessed and used to index other preferred radio stations for searching. In one embodiment, radio station geographic location information is stored in the memory, and the searching operation considers both program content preference and geographic proximity. The memory can be manually programmed, pre-programmed, updated by subscription, or programmed over-the-air by radio transmission. In one embodiment, a global positioning system receiver is employed to provide instantaneous radio location information.

25 Claims, 6 Drawing Sheets

| PUBLIC RADIO 42 | | TALK RADIO 44 | |
|---|---|---|---|
| KABC | 88.1 | KGHI | 92.5 |
| KDEF | 90.3 | KMNO | 96.9 |
| KJLK | 94.7 | KPQR | 100.1 |
| | | KSTU | 102.3 |

| CHRISTIAN 46 | | CLASSICAL 48 | |
|---|---|---|---|
| KHIG | 93.5 | KVWX | 104.5 |
| KKLM | 95.7 | KBCD | 89.1 |
| KNOP | 97.7 | KEFG | 91.3 |
| KQRS | 99.9 | | |

FIG. 3

| | 52 | 54 | 56 | 58 | 60 |
|---|---|---|---|---|---|
| | FREQ. | CALL | LAT. | LON. | PROG. |
| | 88.1 | KABC | 42.15 W | 115.20 N | NPR |
| | 89.1 | KBCD | 46.33 W | 120.30 N | CLSC |
| | 90.3 | KDEF | 43.85 W | 122.95 N | NPR |
| | 91.3 | KEFG | 47.05 W | 116.85 N | CLSC |
| | 92.5 | KGHI | 45.64 W | 117.54 N | TALK |
| | 93.5 | KHIG | 47.80 W | 121.66 N | CRST |
| 62 | 94.7 | KJLK | 42.50 W | 119.50 N | NPR |
| | 95.7 | KKLM | 46.95 W | 118.77 N | CRST |
| | 96.9 | KMNO | 47.40 W | 117.32 N | TALK |
| | 97.7 | KNOP | 44.62 W | 115.01 N | CRST |
| | 99.9 | KQRS | 46.17 W | 119.88 N | CRST |
| | 100.1 | KPQR | 43.87 W | 121.35 N | TALK |
| | 102.3 | KSTU | 46.75 W | 115.45 N | TALK |
| | 104.5 | KVWX | 42.66 W | 121.06 N | CLSC |

FIG. 4

SELECTION OF RADIO STATION BASED ON PREFERRED PROGRAM CONTENT

BACKGROUND OF THE INVENTION

1. Field of the Invention

The present invention relates to radio communications. More specifically, the present invention relates to systems and methods for reception of commercial radio programming while operating in a mobile environment.

2. Description of the Related Art

The operation of a radio receiver in a mobile environment is commonplace. A typical example is an AM/FM receiver operating in an automobile. While travelling, a user often selects radio stations to listen to for information or pleasure. An important factor in selecting a radio station is the broadcast program content of the station in view of the listening preferences of the user. For example, a user may desire to listen to National Public Radio ('NPR'), a public radio program content station, traveling by automobile.

The Federal Communications Commission ('FCC') licenses broadcast radio stations in the United States. Such license grants indicate, among other things, the geographic location of the radio station, the frequency of operation, station call sign, and the maximum transmitter power allowed for the station. This implies that the station will have a predetermined geographic area of coverage. Those who have listen to the radio while traveling readily appreciate that conventional radio stations have limited coverage areas. Consequently, a station may be selected because of its program content and signal strength. However, as the user travels away from the station coverage area, the signal weakens and is ultimately lost. Then, the user may desire to locate another radio station along the traveled route that broadcasts similar search the radio band for another station that broadcasts similar program content.

A user that is travelling and loses a radio station signal will typically search for another station to listen to. User searching is typically accomplished with manual tuning, or sometimes with a scan or seek function built into the radio. While this approach is effective at locating a radio station, it does not readily assist the user in locating a station that broadcasts the desired program content.

Published guides to radio stations are available that list geographic location, station call signs, frequency of operation, and program content. Such a guide can be employed by a user to aid in locating a broadcast radio station. However, such guides are not always readily accessible and are cumbersome to access while travelling. This is especially true when a user travels to a region with which he or she is not familiar.

Another problem arises in rural areas where limited radio service is available. In a situations such as this, the user may seek a specific program content station, such as the aforementioned public radio station, but be unable to locate such a station. Then, the user may prefer to select similar, but different, program content stations. For example, a talk radio format may be preferred as an alternate to public radio, as opposed to a RAP station, for example.

Thus there is a need in the art for a system and/or method for enabling users of radio receivers that operate in a mobile environments to identify and receive radio stations with a desired program content, or preferred alternate program content, as the radio receiver travels though a geographic region larger than the radio coverage area of a single radio station.

SUMMARY OF THE INVENTION

The need in the art is addressed by the apparatus and method taught by the present invention. A radio is taught that is operable to select a station according to the program content of the selected station. The receiver includes a radio receiver that has an input to receive radio station identities that specify radio stations for reception, and an output that indicates the presently received signal strength. Also, a memory with a plurality of radio station identities organized according to program content specifiers stored therein. And, a controller coupled to the output that is operable to recall, and couple to the input, one of the plurality of radio station identities this is referenced to the same program content specifier as the presently specified radio station, when the presently received signal strength meets a predetermined threshold, such as when the radio signal is so weak that the fidelity is unacceptable for listening.

In a refinement of the foregoing apparatus, the plurality of station identities and the program content specifiers are manually programmed into the memory through a user interface on the radio. In another refinement, the plurality of station identities and the program content specifiers are programmed into the memory by the supplier of the radio, which may be the manufacturer, a distributor, a retailer, or service center for the product. In another refinement, the plurality of station identities and the program content specifiers are programmed into the memory through a subscription service. In another refinement, the plurality of station identities and the program content specifiers are programmed into the memory with data received by the radio receiver. In another refinement, the controller operates to sequentially scan the memory to locate the one of the plurality of radio station identities that is recalled and coupled to the input each subsequent time the presently received signal strength meets the threshold. In another refinement, the memory also has a plurality of location coordinates associated with the plurality of radio station identifiers stored within it. In another refinement, the controller is operable to scan the plurality of radio station identifiers in the memory ordered according to the program content specifiers and the location coordinates. In another refinement, the radio further includes a global positioning system receiver coupled to the controller that provides present location coordinates of the radio. In another refinement, the controller operates to search the memory to locate the one of the plurality of radio station identities that is recalled and coupled to the input according to the program content specifier of the presently received signal and the stored location coordinates with respect to the present location coordinates. Thus, it finds a local station rather than a more distant station. In another refinement, the memory has an ordered list of program content specifiers stored within it, and, the controller operates to sequence through the ordered list to define a replacement present program content specifier when the controller in unable to locate and recall one of the plurality of radio station identities referenced to the same program content specifier as the presently specified radio station. In another refinement, the ordered list of program content specifiers is manually programmed into the memory through a user interface on the apparatus, thus allowing the user to enter the preferred programming content in an ordered fashion.

The present invention also teaches a method of selecting radio stations in a radio receiver that has a memory with a plurality of radio station identities organized according to program content specifiers stored within it. The method includes the steps of monitoring the signal strength of a present radio station signal, and determining that the signal strength has met a threshold. Then, selecting a radio station identity from the memory that has the same program content specifier as the present radio station, and, finally tuning the radio receiver according to the selected radio station identity.

In a refinement to the foregoing method, the step of manually programming the plurality of radio station identities and program content specifiers into the memory is added. In another refinement, the plurality of station identities and program content specifiers are programmed into the memory by the supplier of the radio receiver. In another refinement, the plurality of station identities and program content specifiers are programmed into the memory through a subscription service. In another refinement, the plurality of station identities and program content specifiers are programmed into the memory with data received over the air by the radio receiver. In another refinement, the step of sequentially scanning the memory to locate a one of the plurality of radio station identities that is selected each subsequent time the determining step is accomplished is added. In another refinement, the memory has a plurality of location coordinates associated with the plurality of radio station identifiers stored within it. And, the method further includes the step of scanning the plurality of radio station identifiers in the memory, ordered according to the program content specifiers and the location coordinates. In another refinement, the radio receiver has a global positioning systems receiver, and the method includes the further step of obtaining present location coordinates from the global positioning receiver. In another improvement, the step of searching the memory to locate the one of the plurality of radio station identities that is selected according to the program content specifier of the presently tuned signal and the stored location coordinates with respect to the present location coordinates is added. In another refinement, the memory has an ordered list of program content specifiers stored within it. And, the method further includes the steps of sequencing through the ordered list, and defining a replacement present program content specifier if one of the plurality of radio station identities referenced to the same program content specifier as the presently specified radio station is not located. In another refinement, the further step of manually programming the ordered list of program content specifiers into the memory is added.

BRIEF DESCRIPTION OF THE DRAWINGS

FIG. 3 is a memory diagram of an illustrative embodiment of the present invention.

FIG. 4 is a memory diagram of an illustrative embodiment of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
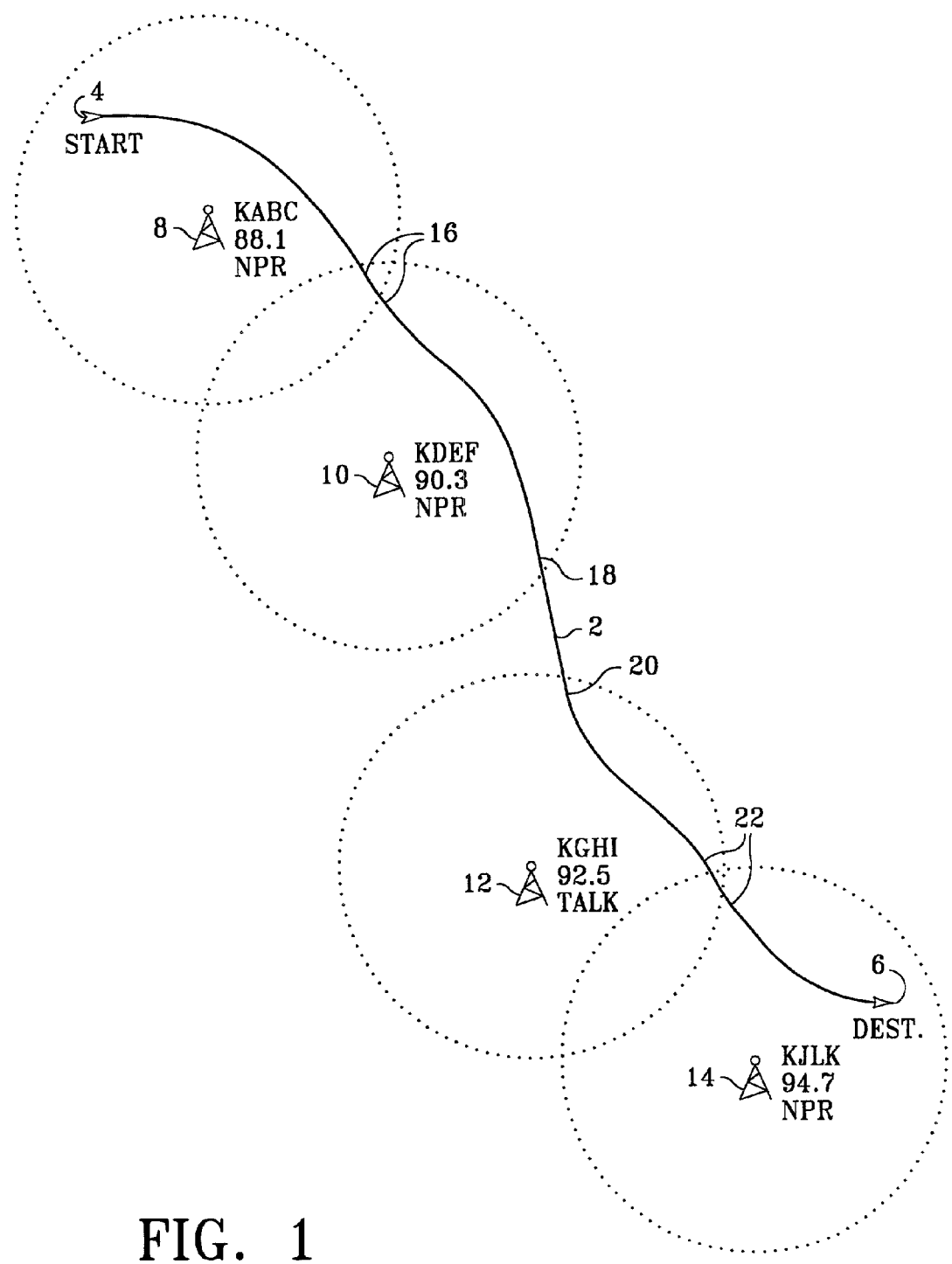
FIG. 1 is an operating environment diagram for an illustrative embodiment of the present invention.

Reference is directed to FIG. 1, which is an operating environment diagram for an illustrative embodiment of the present invention. FIG. 1 is useful to understand the process accomplished, whether manually by a user, or according to the teachings of the present invention, that is employed to received desired radio broadcast signals during travels across a relatively large region. FIG. 1 illustrates a path of travel 2 from a starting location 4 to a destination location 6. Such travel is often times accomplished in a truck or automobile, but the teachings of the present invention are applicable regardless of how movement of the radio receiver is accomplished. In fact, the present invention uses the term 'radio' and this is to be construed to mean all forms of wireless communications of information including, but not limited to audio, data, televisions, images, and other information. As is understood, a large geographic region is typically within the radio coverage range of a large number of radio broadcast stations, commercial and non-commercial. In FIG. 1, these are illustrated, in part, by four radio stations. These fictitious stations include KABC-FM at 88.1 MHz 8, KDEF-FM at 90.3 MHz 10, KGHI-FM at 92.5 MHz 12, and KJLK-FM at 94.7 MHz 14. Each of these FM radio stations has associated with a radio coverage area indicated by the dashed-line encircling each of the aforementioned radio stations in FIG. 1.

In FIG. 1, four fictitious FM broadcast stations are used by way of example. It is to be understood that any broadcast station would be applicable to the teachings herein, especially including FM and AM broadcast stations, as well as other commercial and non-commercial broadcast by various governments and private entities. It is also understood that most broadcast stations focus on certain program content for a variety of reasons, which are beyond the scope of this teaching. The following table illustrates some typical program content used in commercial broadcasting, along with a content designator (technically, an acronym is a word formed from the from the first (or first few) letters of a series of words, as radar, from radio detecting and ranging) that can be used to specify the content descriptor.

| Content | Spec. |
| --- | --- |
| Adult Contemporary | AC |
| Asian | ASN |
| Big Band | BB |
| Blues | R&B |
| Children's | CHLD |
| Christian | CRST |
| Classic Rock | CRCK |
| Classical | CLSC |
| Jazz | JAZZ |
| Latin/Tejano | LAT |
| Hip Hop | HIP |
| Modern Rock | MRCK |
| News/Talk | TALK |
| Oldies | OLD |
| Polka | PLK |
| Public Radio | NPR |
| Rap & Urban | RAP |
| Top 40 | T40 |

In FIG. 1, KABC 8 is a public radio, NPR, station. From the starting point 4, the radio is tuned to receive this station. As travel progress, the radio reaches region 16 located at the boundary between KABC 8 and KDEF 10. Thus, the signal quality from KABC 8 weakens to the point where it is no longer viable to listen to KABC 8. By originally selecting KABC 8, the user of the radio has expressed a preference for NPR programming. Thus, when the signal fades at region 16, the user is most likely to search the radio bands for another NPR broadcast station. Another way to state this is that the user will seek an alternate radio station with the same, or similar, program content. In FIG. 1, this is readily achievable because KDEF is available at region 16, and also offers NPR programming. However, when the radio travels further, to region 18, the signal from KDEF is lost and, as illustrated in FIG. 1, no other radio service is available. Such scenarios do occur in the rural areas of the United States. At this point in the travels, the user of the radio has no choice but to not listen to the desired program content.

In FIG. 1, as travel progresses to region 20, the signal of KGHI 12 becomes available. This illustrates a problem and solution afforded by the teachings of the present invention. Even though the user of the radio has expressed a preference for NPR program content, note that talk radio, TALK, offered by KGHI 12 is similar and may be considered a reasonable alternative when NPR program content is unavailable. Other kinds of programming content may also be acceptable as a substitute. This is a personal preference matter subject to the discretion of each individual user. As travel progresses to region 22, the signal from KGHI 12 weakens and another choice as to station and programming content must be made. At region 22, KJLK 14 is available and this is fortunately an NPR program content station. Finally, the destination 6 is reached in the travels, and this location also falls within the coverage area of KJLK 14, the NPR station.

Figure 2:
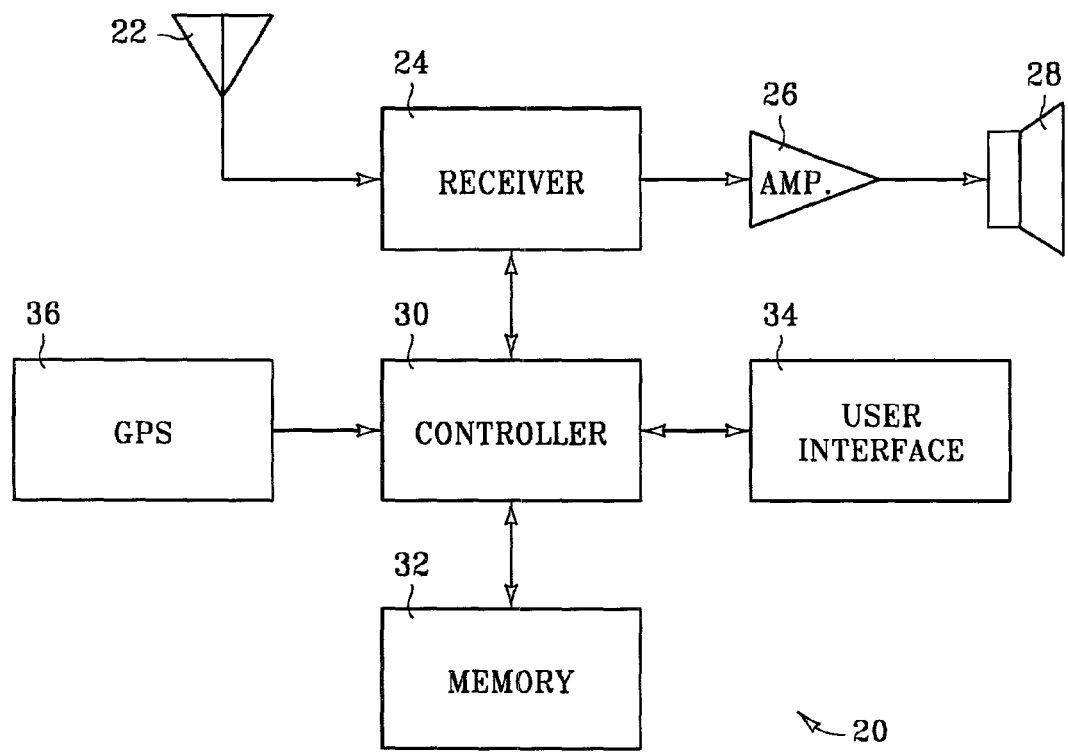
FIG. 2 is a functional block diagram of radio receiver according to an illustrative embodiment of the present invention.

Reference is directed to FIG. 2, which is a functional block diagram of a radio 20 according to an illustrative embodiment of the present invention. The radio 20 includes an antenna 22 for intercepting and receiving broadcast radio signals within the radio bands of interest. A conventional radio receiver 24 is employed, as are understood by those of ordinary skill in the art. The receiver 24 includes an input, which receives radio station identifiers that cause the receiver 24 to tune the radio frequency appropriate for the identified radio station. There are many such identifiers employed, as are understood by those skilled in the art. By way of example, and not limitation, these include a decimal or binary representation of the frequency, an arbitrary frequency reference identifier, a phase-locked loop synthesizer divisor, or other representation of the identified radio channel. The receiver 24 also includes an output, which indicates that quality, or strength, of the received signal at any given time. As is understood by those of ordinary skill in the art, this signal can be a conventional squelch signal, a time integrated squelch signal, a received signal strength indication, or any other expression of signal quality that may be presently available or later developed. The essential characteristic is that it expresses the quality of the signal in some fashion.

The received signal is demodulated in the receiver 24 and the audio band information is coupled to an audio amplifier 26 that drives a loudspeaker 28. Such designs are understood by those of ordinary skill in the art. A user interface 34 is provided. The user interface provides the various input controls as are typically found in such radios. These include, but are not limited to, power, station selection, channel memory access, scan, seek, receive sensitivity, and other key inputs for controlling the various functions of the radio 20. The user interface 34 also includes a display for indicating the frequency of operation, the station identification, such as call sign, an indication of the program content, and other functions typically found in such radios, as are understood by those skilled in the art. The functionality of the radio 20 is largely controlled by a controller 30. Such devices as processors, microprocessors, controllers, and microcontrollers, as are applied to radios by those of ordinary skill in the art are equally applicable to the teachings of the present invention. The controller 30 is coupled to the receiver 24 and is operable to transfer radio station identities to the receiver 24, and thereby control the frequency of reception of the radio 20. In addition, the controller 30 is operable to receive the signal strength indication of received signal quality and to act thereupon, as will be more fully discussed hereinafter. The controller 30 is also coupled to the user interface 34 and is operable to receive inputs and commends from the user interface 34, and also operable to drive the various displays and indicators found on the user interface 34.

The controller 30 is also coupled to a memory 32. Any of the currently employed, or later developed, memory technologies as are understood by those skilled in the art, can be applied to the present invention. These include, but are not limited to ROM, RAM, FLASH, media of various types, and other memory technologies. The controller 30 is operable to address and read data from the memory 32. In applications where the present invention requires that the memory 32 be written to, the controller 30 is operable to address and write to the memory 32. Random or sequentially accessed memory 32 can be employed.

FIG. 2 also illustrates that a global positioning ('GPS') receiver 36 may be coupled to the controller 30. As is understood by those having ordinary skill in the art, GPS receivers 36 monitor signals broadcast from several Earth-orbiting satellites and output a signal accurately indicating the position of the GPS receiver 36. This information includes a representation of the latitude and longitude of the GPS receiver 36. This is useful and important information respecting the present invention for a number of reason, to be explained now and which will later become apparent. There are great numbers or radio broadcast stations in operation at any given moment. And, frequencies are reused over large geographic regions. If the location of a radio is known, as by reading its GPS location coordinates, and if the location coordinates of certain radio broadcast stations are known, then the search space of the controller 30 within memory 32 can be narrowed. This fact reduces the time needed to identify a preferred station, and avoids the problems associated with attempting to tune a frequency that is known to have the desired program content, when a co-channel station is received instead. In other words, a station on the same frequency, by reason of frequency reuse, is received when the controller has selected the frequency as a reference to a station that is broadcasting the user's desired program content. The net effect is that the wrong station, and most likely the wrong program content, is received. Having geographic position information alleviates this problem. Another way to alleviate this problem is to tailor the station and programming information to a smaller geographic region, where the user is known to primarily operate the radio.

Reference is directed to FIG. 3, which is a memory diagram of an illustrative embodiment of the present invention. The memory map 40 is of a portion of memory 32. Within the memory map 40 are plural groupings of radio station identities. Each grouping is organized by a program content specifier. The first grouping 42 is associated with PUBLIC RADIO, or NPR, program content specifier. The stations are identified in this example by the FCC call sign, KABC, KDEF, and KJLK, and by the frequency of broadcasts, 88.1, 90.3, and 94.7 MHz respectively. The second grouping 44 is organized by the TALK RADIO program content specifier. Refer to FIG. 3 for the radio station identities. Similarly, grouping 46 is organized by CHRISTIAN stations, and grouping 48 by CLASSICAL stations. The memory arrangement illustrated in FIG. 3 is instrumental in the implementation of the present invention. When the user of the radio makes a station selection, an associated program content specifier is also selected by virtue of this memory arrangement. Of course, the user specification of the initial channel selection could also be made through the user interface. Once the initial station selection has been made, the controller can later access the memory in an effort to locate a new station to receive. The controller is able to search the memory according to the aforementioned arrangement, and attempt to locate a station that is offering the same or similar program content to that initially selected by the user. This can occur by virtue of the program content specifier taught by the present invention.

The performance of the present invention, when operating in a larger geographic region is enhanced with the addition of location coordinates for the station identities stored in the memory. FIG. 4 illustrates a memory map 50 of such an enhanced implementation of the present invention. A plurality of stations 62 are organized into the memory with information about the frequency of transmission 52, the station call sign 54, the latitude 56, the longitude 58, and the program content specifier 60. This arrangement is beneficial because it allows the controller to access and scan the memory as a database of information about the stored station information. Rather than merely grouping the station information by program content specifier, the controller can scan and search the memory, making selection decisions based both on location (e.g. lat. & long.) as well as program content. The controller begins with a reference location. That can come from a number of sources. For example, it can be the location of the presently selected station, which may have been user selected. It could come from a manual entry by the user, such as the lat. & long., state, ZIP code or so forth. It can also come from the aforementioned GPS receiver that was discussed herein before. Then, when the presently received signal fades, the controller search the memory and prioritizes the selection by program content specifier and geographic location. This speeds the search and eliminates the aforementioned issues.

Respecting the insertion of information into the memory, this can be accomplished in a number of ways. The information about radio station frequencies locations, and program content are available from a number of sources, including certain FCC databases. The manufacturer of the radio could program this information into the radio at the time of manufacture. So to could another entity in the chain of distribution. The user could manually program this information though the user interface of the radio. A subscription service could offer this information on transportable media, this approach has the benefit of allowing simple updates of the data as radio station information changes over time. The information can be transmitted from a radio station to the radio as a data stream with the information stored directly into the memory be the controller. Such approaches, and others, will be appreciated by those skilled in the art, and the claims of the present invention are intended to cover all such variations.

Another aspect of the utilization of the memory in the present invention has to do with the ordered selection of alternative program content when the preferred program content is not available. An additional listing is added to the memory that prioritizes a list of program content specifiers according to a particular user's preference. As noted earlier, a user that prefers primarily NPR program content may first prefer TALK program content, then perhaps CRST, and so forth. The user programs these preference into the memory, as an ordered list. If the highest preference program content is not available, the controller searches for the next most preferred and so forth. This mechanism provides for the best program selection in situations where the available broadcasts are not optimum.

Figure 5:
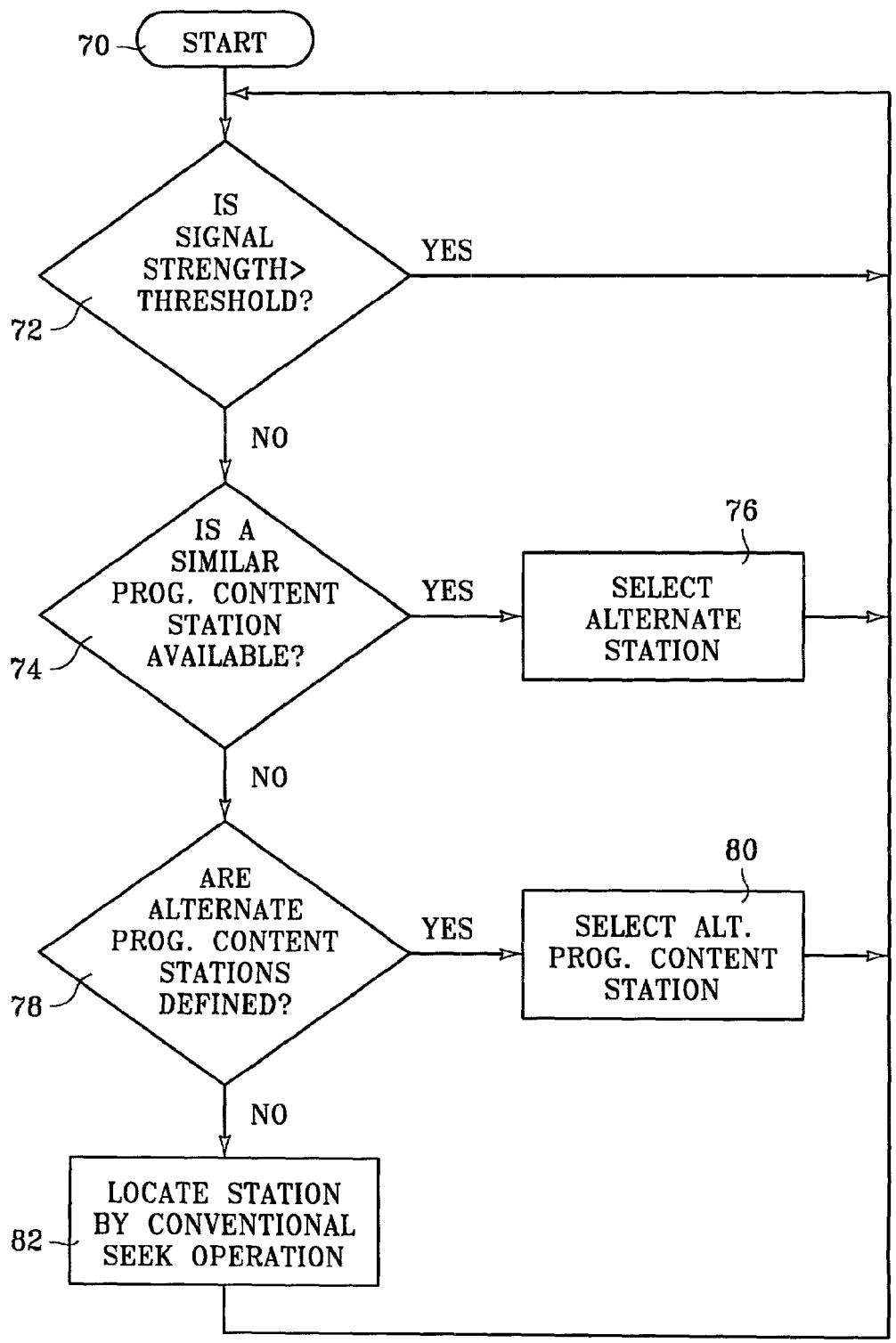
FIG. 5 is a flow diagram of and illustrative embodiment of the present invention.

Reference is directed for FIG. 5, which is a flow diagram of an illustrative embodiment of the present invention. The process starts at step 70 and proceeds to step 72 where the controller conducts a test to determine if the presently received signal strength is greater than an acceptable minimum threshold. If yes, the test repeats in a repetitive loop so as to continuously monitor the received signal. If, and when, the signal fails to meet the threshold at step 72 flow proceeds to step 74. At step 74, the controller searches the memory for a similar program content station to determine if one is available. The techniques discussed herein before are applied. If such a station is identified at step 74 of sufficient signal strength, then the radio station identity is recalled from memory and is transferred to the receiver at step 76 so that the selected station can be received. It is to be understood that step 74 also defines a listing of alternative similar program content stations and each iteration through step 74 sequences through such list, testing for the presence of adequate signal strength before proceeding to step 76, thus enabling the function without the possibility of an infinite flow loop. Flow then recirculates to step 72 where the signal strength loop is re-entered.

On the other hand, at step 74, if no station identity is located in memory according to the preferred program content specifier or the alternative signal's strength is too weak, then a test is conducted at step 78 to determine if an alternate program content identity is available from memory and of sufficient signal strength. It is to be understood that step 78 also defines a listing of alternative program content stations, and each iteration through step 78 sequences through such list, testing for the presence of adequate signal strength before proceeding to step 80, thus enabling the function without the possibility of an infinite flow loop. If one has been entered or programmed, then the controller scans the memory to locate the corresponding radio station identity and that is coupled to the receiver at step 80 for subsequent reception. Flow then returns to step 72 where the signal strength loop is executed. On the other hand, at step 78, is no alternate program content specifier is available of sufficient signal strength, the conventional station seek operation is conducted at step 82. Of course, the user could intervene to manually select a radio station at this point as well.

Figure 6:
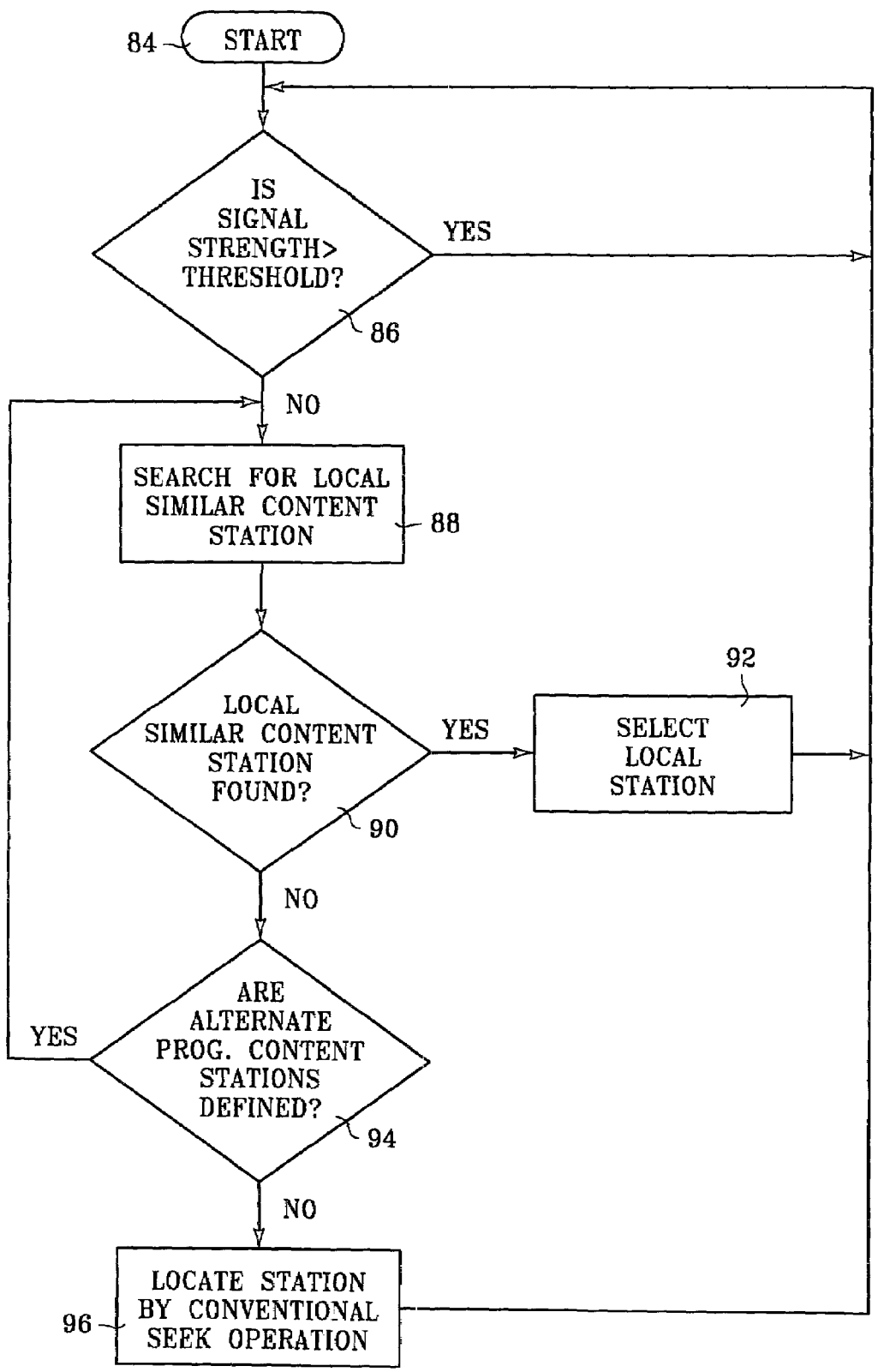
FIG. 6 is a flow diagram of and illustrative embodiment of the present invention.

Reference is directed to FIG. 6, which is a flow diagram of an illustrative embodiment of the present invention. This embodiment is one where the station location information is programmed into the memory. The process begins at step 84 and proceeds to step 86 where a repetitive test of the received signal strength is conducted, similar to that in step 72 of FIG. 5. When the presently received signal strength falls below the threshold at step 86, the controller searches the memory for a local station identifier that is associated with the preferred program content specifier, and that is local to the present location of the radio, at step 88. The dimensions of local are at the discretion of the designer, and can be refined through empirical experience. At step 90, a test is conducted to determine is such a station identifier was located in the memory. It is to be understood that step 90 also defines a listing of alternative similar program content stations, and each iteration through step 90 sequences through such list, testing for the presence of adequate signal strength before proceeding to step 92, thus enabling the function without the possibility of an infinite flow loop. If a station was found, the station identity is recalled and transferred to the receiver at step 92 for subsequent reception and monitoring at step 86.

On the other hand, at step 90, if no station identity is found, flow proceeds to step 94 where a test is conducted to locate and alternate program content specifier in memory. It is to be understood that step 94 also defines a listing of alternative program content stations, and each iteration through step 94 sequences through such list, testing for the presence of adequate signal strength before proceeding to step 88, thus enabling the function without the possibility of an infinite flow loop. If one is found, then flow returns to step 88 where a search is conduct for a radio station identity consistent with the alternative program content specifier. On the other hand, at step 94, if no alternative is found, then flow continues to step 96 where the convention radio seek operation is used to attempt to find a station for reception.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

What is claimed is:

1. An apparatus comprising:
   a radio receiver having an input for receiving radio station identities for specifying radio stations for reception and an output indicating a presently received signal strength;
   a memory having stored therein a plurality of radio station identities organized according to program content specifiers, said memory having stored therein a plurality of geographic location coordinates and frequencies associated with said plurality of radio station identities; and
   a controller coupled to said receiver and said memory and operable to recall one of said plurality of radio station identities referenced to same program content specifier as a presently specified radio station when the presently received signal strength meets a threshold.

2. The apparatus of claim 1 wherein said plurality of station identities and said program content specifiers are manually programmed into said memory through a user interface on the apparatus.

3. The apparatus of claim 1 wherein said plurality of station identities and said program content specifiers are preprogrammed into said memory.

4. The apparatus of claim 1 wherein said plurality of station identities and said program content specifiers are programmed into said memory through a subscription service.

5. The apparatus of claim 1 wherein said plurality of station identities and said program content specifiers are programmed into said memory with data received by said radio receiver.

6. The apparatus of claim 1 wherein said controller is operable to sequentially scan said memory to locate the one of said plurality of radio station identities that is recalled and coupled to said input each subsequent time said presently received signal strength meets said threshold.

7. The apparatus of claim 1 wherein said controller is operable to scan said plurality of radio station identifiers in said memory ordered according to said program content specifiers and said location coordinates.

8. The apparatus of claim 1 further comprising a global positioning system receiver coupled to said controller for providing present location coordinates of the apparatus.

9. The apparatus of claim 7 wherein said controller is operable to search said memory to locate the one of said plurality of radio station identities that is recalled and coupled to said input according to said program content specifier of the presently received signal and said stored location coordinates with respect to said present location coordinates.

10. The apparatus of claim 1 wherein said memory has stored therein an ordered list of program content specifiers, and wherein said controller is operable to sequence through said ordered list to define a replacement present program content specifier when said controller is unable to locate and recall one of said plurality of radio station identities referenced to the same program content specifier as the presently specified radio station.

11. The apparatus of claim 10 and wherein said ordered list of program content specifiers are manually programmed into said memory through a user interface on the apparatus.

12. The apparatus of claim 1 wherein said plurality of station identities and said program content specifiers are programmed into said memory through a subscription service via a radio station.

13. A method of selecting radio stations in a radio receiver having a memory with a plurality of radio station identities organized according to program content specifiers stored therein, said memory having stored therein a plurality of geographic location coordinates and frequencies associated with the plurality of radio station identities, and further comprising the step of scanning the plurality of radio station identities in the memory, ordered according to the program content specifiers and the location coordinates, and said method comprising the steps of:
   monitoring the signal strength of a present radio station signal;
   determining that the signal strength has met a threshold;
   selecting a radio station identity from the memory that has the same program content specifier as said present radio station; and
   tuning the radio receiver according to said selected radio station identity.

14. The method of claim 13 further comprising the step of manually programming the plurality of radio station identities and program content specifiers into the memory.

15. The method of claim 13 wherein the plurality of station identities and program content specifiers are preprogrammed into the memory.

16. The method of claim 13 wherein the plurality of station identities and program content specifiers are programmed into the memory through a subscription service.

17. The method of claim 13 wherein the plurality of station identities and program content specifiers are programmed into the memory with data received by the radio receiver.

18. The method of claim 13 further comprising the step of sequentially scanning the memory to locate a one of the plurality of radio station identities that is selected each subsequent time the determining step is accomplished.

19. The method of claim 13 wherein the radio receiver has a global positioning systems receiver, and further comprising the step of obtaining present location coordinates from the global positioning receiver.

20. The method of claim 19 further comprising the step of searching the memory to locate the one of the plurality of radio station identities that is selected according to the program content specifier of the presently tuned signal and the stored location coordinates with respect to said present location coordinates.

21. The method of claim 19 wherein the memory has stored therein an ordered list of program content specifiers, further comprising the steps of:
sequencing through the ordered list and
defining a replacement present program content specifier if one of said plurality of radio station identities referenced to the same program content specifier as the presently specified radio station is not located.

22. The method of claim 21 further comprising the step of manually programming the ordered list of program content specifiers into the memory.

23. The method of claim 13 further comprising programming the plurality of station identities and program content specifiers into the memory through a subscription service via a radio station.

24. An apparatus comprising:
a radio receiver having an input for receiving radio station identities for specifying radio stations for reception and an output indicating a presently received signal strength;
a memory having stored therein a plurality of radio station identities organized according to program content specifiers, said plurality of radio station identities and said program content specifiers being programmed into said memory through a subscription service, said memory having stored a plurality of geographic location coordinates and frequencies associated with said plurality of radio station identities; and
a controller coupled to said receiver and said memory and operable to recall one of said plurality of radio station identities referenced to the same program content specifier as a presently specified radio station when the presently received signal strength meets a threshold.

25. A method of selecting radio stations in a radio receiver having a memory with a plurality of radio station identities organized according to program content specifiers stored therein said memory having stored a plurality of geographic location coordinates and frequencies associated with said plurality of radio station identities, comprising the steps of:
providing a plurality of station identities and program content specifiers to the memory via a subscription service;
monitoring a signal strength of a present radio station signal;
determining that the signal strength has met a threshold;
upon determining that the signal strength of the present radio station signal has met a threshold, selecting a radio station identity from the memory that has the same program content specifier as said present radio station; and
tuning the radio receiver according to said selected radio station identity.

* * * * *

UNITED STATES PATENT AND TRADEMARK OFFICE
CERTIFICATE OF CORRECTION

PATENT NO. : 7,369,825 B2  Page 1 of 1
APPLICATION NO. : 09/923707
DATED : May 6, 2008
INVENTOR(S) : James Phillip Slupe It is certified that error appears in the above-identified patent and that said Letters Patent is hereby corrected as shown below:

In column 4, line 30, after "with" insert -- it --.

In column 10, line 50, in Claim 13, delete "the" and insert -- a --, therefor.

In column 10, line 55, in Claim 13, delete "the" before "same".

In column 12, line 12, in Claim 24, delete "the" before "same".

In column 12, line 19, in Claim 25, after "therein" insert -- , --.

In column 12, line 32, in Claim 25, after "has" delete "the".

Signed and Sealed this

Thirtieth Day of September, 2008

JON W. DUDAS
*Director of the United States Patent and Trademark Office*